United States Patent [19]

DePuydt et al.

[11] Patent Number: 5,879,962
[45] Date of Patent: Mar. 9, 1999

[54] III-V/II-VI SEMICONDUCTOR INTERFACE FABRICATION METHOD

[75] Inventors: James M. DePuydt, Stillwater; Michael A. Haase, St. Paul; Kwok-Keung Law, Maplewood; Thomas J. Miller, Minneapolis, all of Minn.; James M. Gaines, Geldrop, Netherlands; Supratik Guha, New York, N.Y.; Bor-Jen Wu, Woodbury, Minn.

[73] Assignee: Minnesota Mining and Manufacturing Company, St. Paul, Minn.

[21] Appl. No.: 571,607

[22] Filed: Dec. 13, 1995

[51] Int. Cl.$^6$ .................................................. H01L 21/00
[52] U.S. Cl. .................................................. 438/47
[58] Field of Search .......................... 437/23, 905, 906, 437/105, 106, 107, 129; 372/44, 45; 257/94; 438/46, 47; 148/DIG. 95

[56] References Cited

U.S. PATENT DOCUMENTS

| | | | |
|---|---|---|---|
| 4,794,606 | 12/1988 | Kondow et al. | 372/45 |
| 5,291,507 | 3/1994 | Haase et al. | 372/44 |
| 5,306,386 | 4/1994 | de Lyon | 156/612 |
| 5,319,219 | 6/1994 | Cheng et al. | 257/14 |
| 5,372,970 | 12/1994 | Kubo | 437/105 |
| 5,389,800 | 2/1995 | Itaya et al. | 257/94 |
| 5,399,206 | 3/1995 | de Lyon | 148/334 |
| 5,481,558 | 1/1996 | Ikeda et al. | 372/44 |
| 5,492,080 | 2/1996 | Ohkawa et al. | 437/105 |
| 5,556,462 | 9/1996 | Celii et al. | 437/105 |

FOREIGN PATENT DOCUMENTS

| | | | |
|---|---|---|---|
| 0 532 104 | 3/1993 | European Pat. Off. | H01L 33/00 |

OTHER PUBLICATIONS

Li et al., ZnSe Nucleation on the GaAs (001):Se–(2x1) Surface Observed by Scanning Tunneling Microscopy, J. Vac. Sci. Technol. B, Jul./Aug. 1994, pp. 1–9, 6 figures, 1994.

PCT International Search Report, PCT/US96/19284, mailed Apr. 17, 1997 (7 pages).

Workshop on Critical Issues in Epitaxy, Boulder, Co, USA, 22–24 Jun. 1994, vol. 30, No. 2–3, ISSN 0921–5107, Materials Science & Engineering B (Solid–State Materials for Advanced Technology), Mar. 1995; Switzerland, pp. 73–80, XP002029034 Pashley M D et al.: "Scanning tunneling microscopy studies of the GaAs (001) surface and the nucleation of ZnSe on GaAs (001)".

Thin Solid Film, vol. 231, No. 1/02, 25 Aug. 1993, pp. 190–196, XP000393377 Gunshor R L et al.: "The molecular beam epitaxial growth of wide gap II–VI injection lasers and light–emitting diodes".

Journal of Crystal Growth, vol. 150, No. 1/04, part 02, May 1995, pp. 743–748, XP000627808 Behr T. et al.: "Structural and electrical properties of ZnSe laser diodes optimized by transmission electron microsopy, reflection high energy electron diffraction, x–ray diffraction and C–V profiling".

Kamata et al. "Characterization of ZnSSe on GaAs by Etching and X–Ray Diffraction," Journal of Crystal Growth 142 (1994), pp. 31–36.

Guha, et al. "Structural Quality and the Growth Mode in Epitaxial ZnSe/GaAs (100)," J. Appl. Phys. 73 (5), 1 Mar. 1993, pp. 2294–2300.

Gaines et al. "Structural Properties of ZnSe Films Grown by Migration Enhanced Epitaxy," J. Appl. Phys. 73 (6), 15 Mar. 1993, pp. 2835–2840.

Li et al. "ZnSe Nucleation on the GaAs (001):Se–(2x1) Surface Observed by Scanning Tunneling Microscopy," J. Vac. Sci. Technol. B (Jul./Aug. 1994), 9 pages of text and 6 pages of figures.

Cheng et al. "Molecular–beam Epitaxy Growth of AnSe Using a Cracked Selenium Source", J. Vac. Sci. Technol. B 8 (2), Mar./Apr. 1990, pp. 181–186.

Ludeke et al. "MBE Surface and Interface Studies", The Technology and Physics of Molecular Beam Epitaxy, pp. 555–565.

Kuo et al., Dependence of the density and type of stacking faults on the surface treatment of the substrate and growth mode in $ZnS_xSe_{1-x}$/ZnSe buffer layer/GaAs heterostructures. Appl. Phys. Lett 67 (22), 27 Nov. 1995, pp. 3298–3300.

*Primary Examiner*—Brian Dutton
*Attorney, Agent, or Firm*—Faegre & Benson LLP

[57] ABSTRACT

A method for repeatably fabricating GaAs/ZnSe and other III-V/II-VI semiconductor interfaces with relatively low stacking fault densities in II-VI semiconductor devices such as laser diodes. The method includes providing a molecular beam epitaxy (MBE) system including at least a group III element source, a group II element source, a group V element source and a group VI element source. A semiconductor substrate having a III-V semiconductor surface on which the interface is to be fabricated is positioned within the MBE system. The substrate is then heated to a temperature suitable for III-V semiconductor growth, and a crystalline III-V semiconductor buffer layer grown on the III-V surface of the substrate. The temperature of the semiconductor substrate is then adjusted to a temperature suitable for II-VI semiconductor growth, and a crystalline II-VI semiconductor buffer layer grown on the III-V buffer layer by alternating beam epitaxy. The group II and group VI sources are operated to expose the III-V buffer layer to a group II element flux before exposing the III-V buffer layer to a group VI element flux.

28 Claims, 3 Drawing Sheets

III-V/II-VI SEMICONDUCTOR INTERFACE FABRICATION METHOD

GOVERNMENT RIGHTS

The United States government has certain rights in this invention pursuant to Contract No. DAAH04-94-C0049 awarded by the Advanced Research Projects Agency and the Department of the Army/Army Research Office, and Contract No. N00014-92-C-0122 awarded by the Advanced Research Projects Agency and the Office of Naval Research.

BACKGROUND OF THE INVENTION

1. Field of the Invention

The present invention relates generally to methods for fabricating II-VI semiconductor electronic devices. In particular, the present invention is a method for fabricating an interface between layers of III-V semiconductor and II-VI semiconductor.

2. Description of the Related Art

Electronic devices made from ZnSe, MgZnSSe and other II-VI semiconductors are generally known. By way of example, laser diodes fabricated by molecular beam epitaxy (MBE) from these and other II-VI semiconductor compounds are disclosed in the Haase et al. U.S. Pat. No. 5,291,507 and the Cheng et al. U.S. Pat. No. 5,319,219. These devices are typically fabricated on substrates of GaAs or other III-V semiconductor compounds.

Unfortunately, defects known as stacking faults form at or near the interface of the III-V and II-VI semiconductors during MBE growth. Techniques for measuring stacking fault densities in III-V/II-VI interfaces are known, and disclosed in the Kamata et al. article, Characterization of ZnSSe on GaAs by Etching and X-ray Diffraction, J. Crystal Growth, Vol. 142, pp. 31–36 (1994). It is very important to minimize the presence of these stacking faults since they act as non-radiative recombination centers, dissipate recombination energy, generate further defects and thereby shorten the operative lifetime of the devices.

Known methods for growing II-VI semiconductors on III-V substrates, and for preparing the substrates for II-VI semiconductor growth, are disclosed in the following references:

1. S. Guha et al., Structural Quality and the Growth Mode in Epitaxial ZnSe/GaAs(100), J. Appl. Phys., Vol. 73, No. 5, pp. 2294–2300 (March 1993).
2. J. Gaines et al., Structural Properties of ZnSe Films Grown by Migration Enhanced Epitaxy, J. Appl. Phys., Vol. 73, No. 5, pp. 2294–2300 (March 1993).
3. D. Li et al., ZnSe Nucleation on the GaAs(001):Se-(2×1) Surface Observed by Scanning Tunneling Microscopy, J. Vac. Sci Technol. B. (July/August 1994).
4. Cheng et al., Molecular-Beam Epitaxy Growth of ZnSe Using a Cracked Selenium Source, J. Vac. Sci. Technol. B., Vol. 8, No. 2 (March/April 1990).
5. The Technology and Physics of Molecular Beam Epitaxy, edited by E. H. C. Parker, Plenum Press, 1985.

In general, one approach involves nucleating ZnSe on a bare GaAs substrate that has been heated (either in the II-VI growth chamber or a separate ultra-high-vacuum chamber) to desorb native oxide. However, this approach presents a number of problems. Thermally treating the GaAs surface tends to increase surface roughness, and the possibility of incomplete substrate deoxidation remains. The stoichiometry of the starting GaAs surface is difficult to control by this process. Contamination of the GaAs surface by the group VI elements in the II-VI growth chamber has been observed. It is also difficult to reproducibly obtain high-quality interfaces by this method Another approach involves desorbing the GaAs substrate in a separate GaAs growth chamber under an As flux (to reduce Ga evaporation and surface roughening). A GaAs buffer layer is grown on the substrate to obtain a smooth GaAs surface. The wafer is then cooled, transferred in-vacuo to a II-VI growth chamber, and heated to approximately 300° C. for ZnSe nucleation. Although an improvement over the technique described above, this growth method still suffers from a number of disadvantages, such as increased contamination due to cooling of the GaAs buffer layer and transfer through the ultra high vacuum pipeline, and contamination by the group VI source. For these and other reasons, a sufficient level of reproducibility has not been demonstrated.

In general, it is difficult to reproducibly fabricate III-V/II-VI interfaces with stacking fault densities less than about $1-5\times10^6/cm^2$ using these known techniques. The commercial viability of laser diodes and other II-VI semiconductor devices would be greatly enhanced by methods enabling these devices to be reproducibly fabricated with lower stacking fault densities.

SUMMARY OF THE INVENTION

The present invention is an improved method for fabricating III-V/II-VI semiconductor interfaces. Tests have demonstrated that the method can be used to reproducibly fabricate interfaces of this type having stacking fault densities less than $1\times10^4/cm^2$.

The method includes providing a molecular beam epitaxy (MBE) system including at least a group III element source, a group II element source, a group V element source and a group VI element source. A semiconductor substrate having a III-V semiconductor surface on which the interface is to be fabricated is positioned within the MBE system. The substrate is then heated to a temperature suitable for III-V semiconductor growth, and a crystalline III-V semiconductor buffer layer grown on the III-V surface of the substrate. The temperature of the semiconductor substrate is then adjusted to a temperature suitable for II-VI semiconductor growth, and a crystalline II-VI semiconductor buffer layer grown on the III-V buffer layer by alternating beam epitaxy. The group II and group VI sources are operated to expose the III-V buffer layer to a group II element flux and grow a layer of the group II element before exposing the III-V buffer layer to a group VI element flux.

In one embodiment of the invention, the method is performed in an MBE system including first and second MBE chambers interconnected by an ultra-high vacuum transfer pipeline. The first MBE chamber includes at least a group III element source and a group V element source. The second MBE chamber includes at least a group II element source and a group VI element source. The semiconductor substrate is heated to the III-V growth temperature, and the III-V buffer layer grown on the substrate, in the first MBE chamber. The semiconductor substrate with the III-V buffer layer is then transferred to the second MBE chamber through the ultra-high vacuum pipeline. The temperature of the substrate is adjusted to the II-VI growth temperature, and the substrate is treated by depositing the group II element. The II-VI buffer layer is grown on the treated III-V buffer layer by migration enhanced epitaxy (MEE) in the second MBE chamber.

In another embodiment the interface is grown in an MBE chamber including at least a group III element source, a group II element source, a valved group V element source and a valved group VI element source. The substrate is heated and the III-V buffer layer grown on the substrate while the valve on the group VI source is closed. The substrate temperature is then adjusted, and the substrate is treated by depositing the group II element. The II-VI buffer layer is grown on the treated III-V buffer layer by migration enhanced epitaxy (MEE) while the valve on the group V source is closed.

DETAILED DESCRIPTION OF THE PREFERRED EMBODIMENTS

Figure 1:
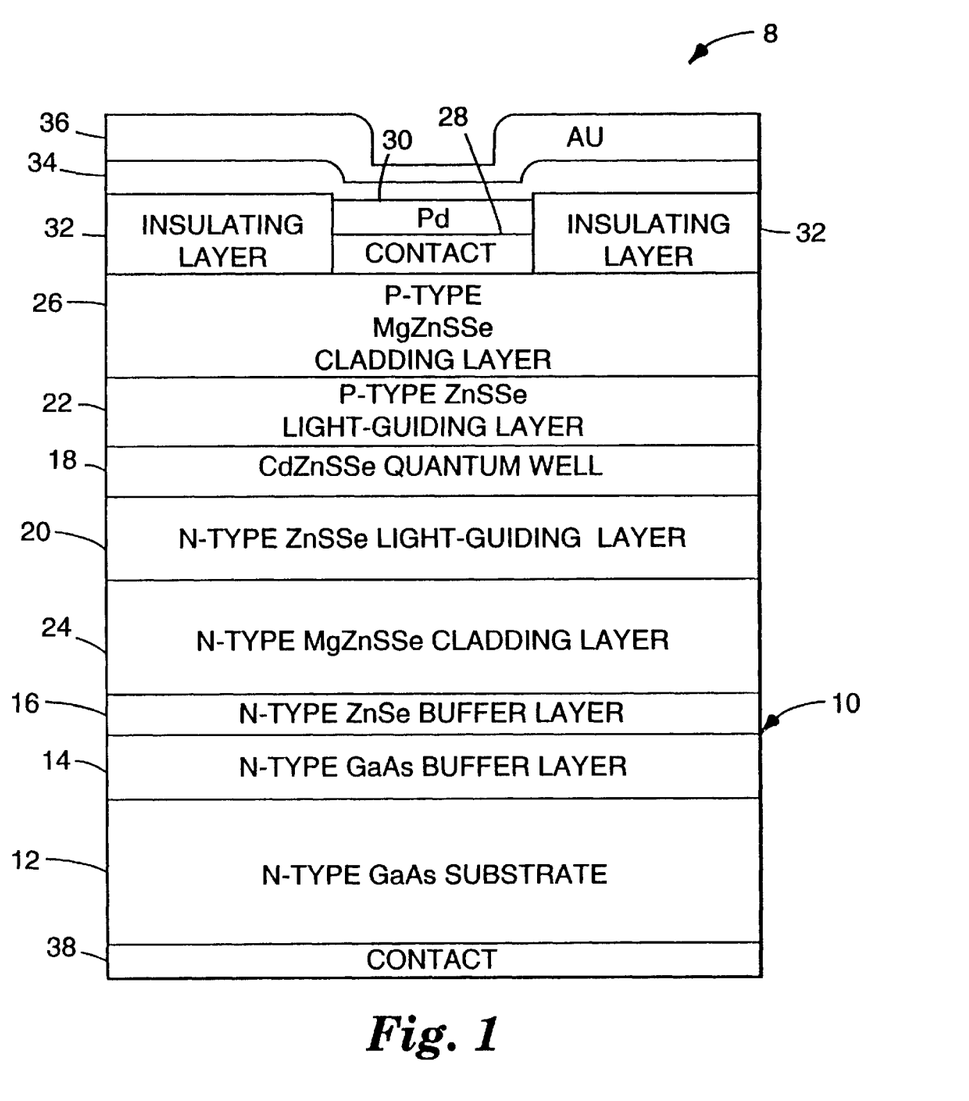
FIG. 1 is a cross sectional view (not to scale) illustrating the structure of a II-VI semiconductor laser diode which includes a III-V/II-VI semiconductor interface fabricated in accordance with the present invention.

A laser diode 8 which includes a III-V/II-VI semiconductor interface 10 fabricated in accordance with the present invention is illustrated in FIG. 1. Laser diode 8 is a gain-guided, separate confinement, wide band gap II-VI device fabricated on an n-type GaAs (i.e., III-V) semiconductor substrate 12. In the embodiment shown, the interface 10 includes an n-type GaAs semiconductor buffer layer 14 on the surface of substrate 12, and an n-type ZnSe (i.e., II-VI) semiconductor ohmic contact or buffer layer 16 on the GaAs buffer layer. Interface 10 provides a low stacking fault density transition between the crystalline lattice of III-V substrate 12 and the lattice of the II-VI semiconductor layers deposited on the substrate, thereby enhancing the functional characteristics of the laser diode while it is operating. III-V/II-VI interfaces 10 with stacking fault densities less than $1 \times 10^4/cm^2$ have been reproducibly grown by this technique.

The separate-confinement structure of the device includes an intrinsic-type CdZnSSe quantum well active layer 18 within a pn junction formed by n-type ZnSSe light-guiding layer 20 and p-type ZnSSe light-guiding layer 22. Light generated in quantum well layer 18 is confined within light-guiding layers 20 and 22 by n-type MgZnSSe cladding layer 24 and p-type MgZnSSe cladding layer 26. A p-type ZnSeTe graded composition ohmic contact layer 28 overlays p-type cladding layer 26. Electrical contact to ohmic contact layer 28 is made by Pd electrode 30. Ohmic contact layer 28 and electrode 30 are formed in an open stripe in insulating layer 32. A thin Ti layer 34 and a final Au layer 36 are applied over electrode 30 and insulating layer 32 to facilitate lead bonding. Electrical contact to the lower side of substrate 12 is made by substrate contact 38.

Figure 2:
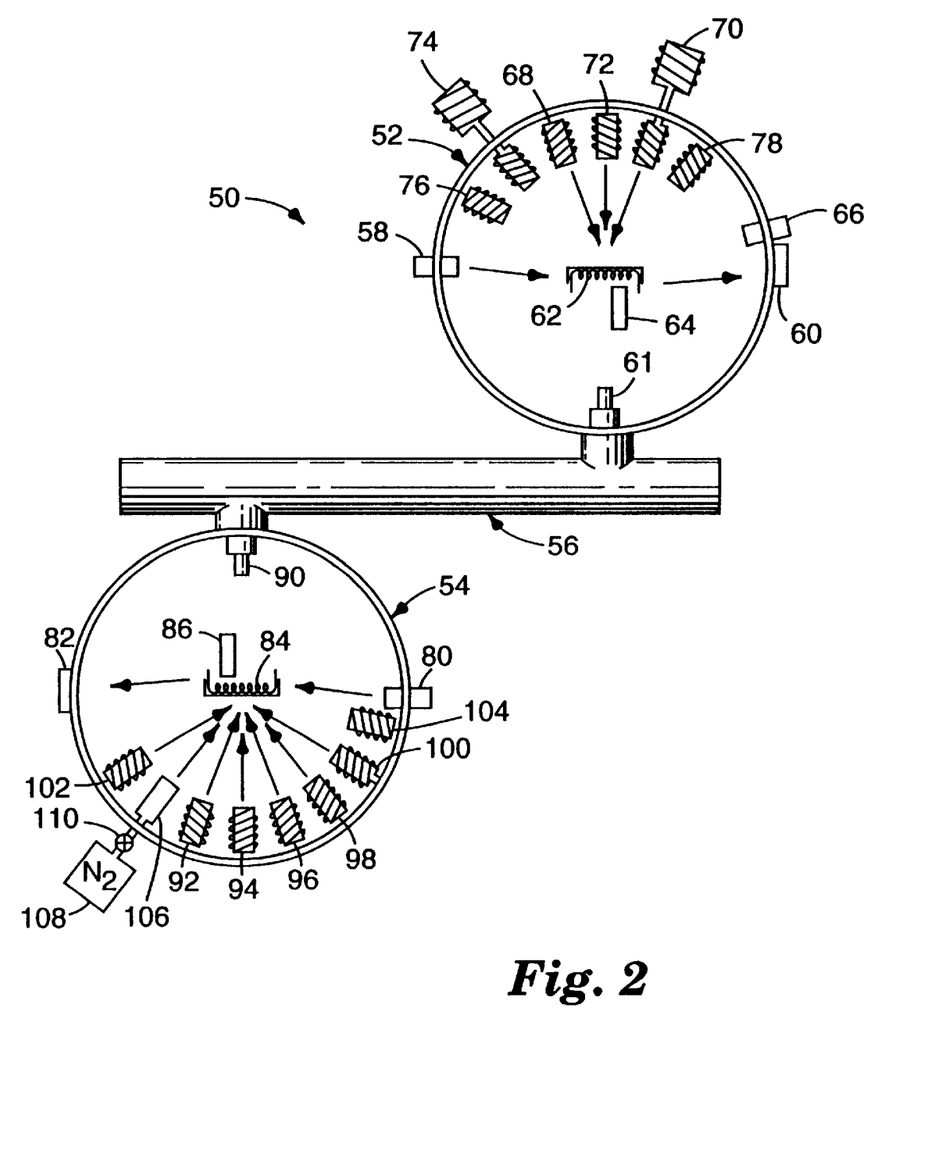
FIG. 2 is a schematic illustration of a molecular beam epitaxy system used in accordance with a first embodiment of the present invention to fabricate the III-V/II-VI interface and laser diode shown in FIG. 1.

FIG. 2 is an illustration of a molecular beam epitaxy (MBE) system 50 used in accordance with a first embodiment of the present invention to fabricate laser diode 8. As shown, MBE system 50 includes a first growth chamber 52 and a second growth chamber 54 interconnected by an ultra-high-vacuum transfer pipeline 56. Chamber 52 includes a high energy electron gun 58 and phosphor screen 60 to monitor the structural characteristics of semiconductor layers using reflection high energy electron diffraction (RHEED). Chamber 52 also includes flux monitor 61, substrate heater 62, thermocouple 64 and infrared pyrometer 66.

Buffer layers 14 and 16 are grown on substrate 12 in first growth chamber 52. The sources mounted to chamber 52 include a shuttered Ga (i.e., a group III element) effusion cell 68, a valved As (i.e., group V element) cracking effusion cell 70, a shuttered Zn (i.e., group II element) effusion cell 72 and valved and shuttered Se (i.e., group VI element) cracking effusion cell 74. Although not used in the embodiment described herein, it would be desirable to incorporate a shutter in addition to a valve in the As effusion cell. A Si effusion cell 76 and a Cl effusion cell 78 (which uses $ZnCl_2$ as source material) are provided as sources of n-type dopants. In one embodiment the orifice of Se cell 74 is less than about 5 mm. In a preferred embodiment the orifice of Se cell 74 is about 2 mm.

Growth chamber 54 also includes a high energy electron gun 80, phosphor screen 82, substrate heater 84, thermocouple 86, and flux monitor 90. Substrate temperatures within chambers 52 and 54 are also measured by a system (not shown) which monitors the band gap absorption edge of the substrate. Absorption edge temperature measurement systems of this type are generally known. Briefly, infrared light from the substrate heater 82 passes through both the substrate and a window in the chamber, and is collected by a lens and optical fiber. A computer-controlled spectrometer coupled to the optical fiber continuously measures the spectrum of the collected light. The band gap absorption edge can be clearly identified by the spectrometer. The wavelength of the absorption edge is then compared to the known temperature dependence of the substrate band gap to reproducibly determine the substrate temperature. The temperature dependence of the band gap of GaAs, for example, is described in the J. S. Blakemore article Semi conducting and other major properties of gallium arsenide, Journal of Applied Physics, vol. 53, no. 10, p. R155 (1982).

Device layers 24, 20, 18, 22, 26 and 28 are grown in chamber 54. Accordingly, the sources mounted to chamber 54 include Zn effusion cell 92, ZnS effusion cell 94 (as a source of both Zn and S), Cd effusion cell 96, Se effusion cell 98, Mg effusion cell 100 and Te effusion cell 102. Cl effusion cell 104 (which uses $ZnCl_2$ source material) is provided as a source of n-type dopant. The p-type dopant is provided by N free radical (plasma) source 106. Free radical source 106 is connected to a source 108 of ultra-pure $N_2$ through leak valve 110.

The above-described components of MBE system 50 are commercially available. By way of example, the MBE system 50 used to fabricate prototype laser diodes 8 and the interface sample wafers described below include a Perkin Elmer Model 430 system with effusion cells from EPI MBE Equipment Group of St. Paul, Minn., and Perkin Elmer. In one embodiment, the valved As cell 70 is an EPI model PE-500V-As cell, and the valved Se cell 74 is an EPI model PE-500V-Se cell. A dual-filament Ga cell 68 is used to minimize oval defect formation during the growth of buffer layer 14. A free radical plasma source 106 from Oxford Applied Research Ltd. of Oxfordshire, U.K. was incorporated into this MBE system 50. The chambers 52 and 54 and pipeline 56 are pumped in a conventional manner using ion pumps, cryopumps and turbomolecular pumps. In-situ RHEED techniques were used to monitor the reconstructed surface layers of the growing semiconductor. Techniques of these types are known and disclosed, for example, in Chapter 16, "MBE Surface and Interface Studies," from The Technology and Physics of Molecular Beam Epitaxy, edited by E. H. C. Parker, Plenum Press, 1985. Substrate temperature measurements in chamber 52 reported to be below about 500° C. were generally based on absorption edge measurements, while measurements above this temperature are generally based on readings from infrared pyrometer 66. After MBE system 50 is set up for operation and the source materials loaded, conventional procedures are used to bake the system and outgas the charge materials. Laser diode 8 is fabricated on an indium-free molybdenum block (not shown) which is moved through system 50 by a sample manipulator (also not shown) in a conventional manner. As used throughout the following description of the process by which laser diode 8 is fabricated, the term "wafer" means the semiconductor substrate 12 and any layers of semiconductor, metal, insulator or other materials that have been grown or otherwise deposited on the substrate through the stage of the process being referenced.

Chamber 52 is prepared in such a manner as to minimize Se and other contamination prior to the introduction of the GaAs substrate 12 on which the III-V/II-VI interface 10 is to be grown. This preparation procedure includes outgassing the sample manipulator and bare molybdenum block, the Ga cell 68 and the Zn cell 72. The sample manipulator is outgassed by heating the bare molybdenum block sample to about 700° C. for an outgassing period of about 60 minutes, after which it is lowered to a temperature of about 400° C. Effusion cells 68 and 72 are outgassed by heating them for an outgassing period to a temperature which is about 30° C. above their operating temperatures. After outgassing, the temperatures of Ga cell 68 and Zn cell 72 are reduced to their operating temperatures (typically about 1080° C. for the Ga cell and 320° C. for the Zn cell). Outgassing the Ga cell 68 may also reduce the level of ambient Se in chamber 52 through chemical reactions with the Se at the chamber walls. Temperatures of the Si and Cl cells 76 and 78, respectively, are. ramped up to their operating temperatures during the outgassing procedures described above. The bulk crucibles of the As and Se cells 70 and 74, respectively, are heated to and remain at their operating temperatures, with their valves (and the shutter of the Se cell) closed to isolate the source materials from the chamber 52. The cracker zone of the Se cell 74 is heated at this time to about 600° C., and the cracker zone of the As cell 70 is also heated to about 775° C. at this time for outgassing. The cracker zone of the Se cell 74 remains at a temperature of about 600° C. during operation of the As cell 70, to reduce the amount of As that might otherwise condense on the cell and later outgas during ZnSe growth. A titanium sublimator pump (not shown) positioned inside chamber 52 is also operated during these procedures to reduce contamination. GaAs substrate 12, which has been previously mounted to the sample block and pre-outgassed at a temperature of about 300° C., is then positioned in chamber 52 by the manipulator.

Substrate 12 is deoxidized in preparation for the growth of GaAs buffer layer 14. This procedure is performed by opening the valve on cell 70 to provide an As flux in chamber 52, while heating the substrate 12 to its oxide desorption or deoxidation temperature (about 600° C.). The RHEED pattern on the surface of the substrate 12 is monitored during this heating operation for indications of deoxidation, and the (deoxidation) temperature at which deoxidation is clearly observed is noted or recorded. When deoxidation is observed, the temperature of the substrate 12 is further increased to a temperature about 40°–50° C. higher than the deoxidation temperature for a period (about 5 minutes) to remove any residual oxides. Substrate 12 is then allowed to cool and stabilize (typically 5 minutes or less) to a III-V semiconductor growth temperature about equal to the deoxidation temperature (i.e., about 600° C.).

Following the substrate outgassing and deoxidation procedure, the growth of GaAs buffer layer 14 is initiated by opening the shutter on Ga cell 68. The RHEED pattern is monitored during the growth of the GaAs buffer layer 14, and the As flux is set to a level slightly above that required to maintain an As-stabilized (2×4) reconstruction during the growth. The temperature of the As cracker cell is maintained at about 775° C. The shutter on Si cell 76 is also opened to dope the growing GaAs buffer layer 14 n-type with Si in a conventional manner. In one embodiment, layer 14 is doped to a net donor concentration of about $1-5\times10^{18}$ cm$^{-3}$. At these operating characteristics the growth rate of GaAs buffer layer 14 has been observed to be about 1 µm/hour.

Growth of GaAs buffer layer 14 is stopped by closing (shuttering off) effusion cells 68 and 76. The wafer is then allowed to cool to a temperature suitable for the growth of ZnSe buffer layer 16. In one embodiment of the fabrication process, the wafer is cooled to a temperature of about 315° C. over a time period of about 20 minutes. This cooling is done initially under an As flux.

In particular, when the wafer drops to a temperature which is about 20°–30° C. below the GaAs growth temperature, the valve on As cell 70 is closed. Quickly thereafter, the RHEED pattern will change from As-stabilized (2×4) to Ga-stabilized (3×1). After further cooling, the RHEED pattern slowly transforms back to an As-stabilized (2×4) reconstruction (at a temperature of about 400°–450° C.). After the valve on the As cell 70 has been closed, the cracker zone of the As cell is cooled to about 500° C. At this time the cracker zone on the Se cell 74 is cooled to about 350° C., a temperature that will produce little or no cracking of the Se molecule since no such cracking is desired. This growth procedure for GaAs buffer layer 14 is performed with the valve on the Se cell 74 closed. GaAs buffer layer 14 has been grown to thicknesses in the range of about 200–400 nm in prototype laser diodes 8.

It is believed that by closing the valve on the As cell 70 at the above-described temperature, the temperature is sufficiently high that As on the surface at the time of the valve closure will leave, with the surface of the wafer becoming As-deficient at first. However, upon further cooling As from the underlying GaAs apparently comes to the surface to fill the vacancies. This process may be self limiting, so just enough (i.e., no excess) As comes to the surface, thereby resulting in fewer stacking faults.

As the wafer cools following the fabrication of GaAs buffer layer 14 (i.e., after the valve on As cell 70 is closed), it is prepared for the growth of ZnSe buffer layer 16 by opening the shutter on Zn cell 72 to expose the wafer to a Zn flux (i.e., Zn treatment). In one embodiment the Zn cell 72 is shuttered open when the temperature of the wafer has decreased to about 375°–425° C., and after the RHEED pattern has fully transformed to As-stabilized (2×4).

The opening of the shutter on Zn cell 72 causes no immediately detectable change in the RHEED pattern. The surface reconstruction therefore remains As-stabilized (2×4). However, with continued cooling of the wafer the RHEED pattern will show a gradual reconstruction change from As-stabilized (2×4) to (1×4), with the half order streaks in the 2× pattern disappearing over the course of about a 5°–10° C. decrease in temperature. The transition temperature at which this reconstruction change occurs is typically about 320°–330° C. The wafer is then adjusted to a ZnSe growth temperature of about 315° C. which is just below the transition temperature to enable two-dimensional nucleation during the growth of ZnSe layer 16. Higher growth temperatures (e.g., temperatures closer to or above the transition temperature) have been observed to result in increasingly three-dimensional nucleation and a higher stacking fault density. The reason may be that Zn does not adhere to the surface of GaAs buffer layer 14 at temperatures equal to or above the transition temperature. However, at the growth temperature employed, there appears to be enough Zn on the surface of the buffer layer 14 to enable the two-dimensional nucleation.

Growth of the ZnSe buffer layer 16 is initiated after the wafer temperature is stabilized at the desired ZnSe growth temperature. In the embodiment described herein, growth of buffer layer 16 is initiated using an alternating beam epitaxy technique such as atomic layer epitaxy (ALE) and/or migration enhanced epitaxy (MEE). These semiconductor growth techniques are generally known and disclosed, for example, in the Gaines et al. article, Structural Properties of ZnSe Films Grown by Migration Enhanced Epitaxy, J. Appl. Phys., Vol. 73, No. 6, pp. 2835–2840 (Mar. 15, 1992). Using these techniques, at least the initial portion of buffer layer 16 is formed as a series of overlaying layers (e.g., monolayers) of Zn and Se. The remainder of buffer layer 16 can be grown by conventional MBE techniques to a thickness which is less than the critical thickness of about 150 nm. The observed RHEED pattern following the growth of buffer layer 16 is a sharp and streaky (2×1) pattern indicating smooth two-dimensional growth.

Control over the composition and thickness of the Zn and Se monolayers of buffer layer 16 are accurately achieved by ALE and/or MEE. Monolayer growth is controlled primarily by the sequence and timing by which the shutters on the Zn cell 72 and Se cell 74 are opened and closed. The valve on Se cell 74 remains open during the growth of buffer layer 14. The following is the sequence and timing by which cells 72, 74 and 78 are operated to grow at least the initial portion of buffer layer 16.

1. Open the shutter on the Zn cell for a Zn deposition period.
2. Close the shutter on the Zn cell following the Zn deposition period, and keep the Zn cell shutter and the Se cell shutter closed for a growth interrupt period.
3. Open the shutter on the Se cell for a Se deposition period.
4. Close the shutter on the Se cell following the Se deposition period, and keep the Se cell shutter and the Zn cell shutter closed for a growth interrupt period.
5. Repeat steps 1–4 a predetermined number of deposition cycles to grow a ZnSe buffer layer.
6. Open and close the shutter of the Cl cell along with the opening and closing of the Zn cell every third cycle to dope the Zn and therefore the ZnSe buffer layer n-type.

In one embodiment, prototype laser diodes 8 were fabricated in the manner described above with a Zn deposition period and a Se deposition period of about 4 seconds each. The growth interrupt period in this embodiment was about 2 seconds. Twenty-one to eighty-four deposition cycles were used to fabricate the buffer layers 16 on the sample wafers described below. The deposition rate under these conditions was about 0.5 monolayers per cycle. These prototypes were grown with the Se valve closed until it was opened to deposit the first Se monolayer of buffer layer 16. The resulting thickness of these buffer layers 16 was about 10–20 nm.

A number of sample wafers including GaAs/ZnSe interfaces such as those described above were grown on GaAs substrates. These sample wafers were grown with buffer layers having a range of growth parameters as noted below. The stacking fault densities of these samples were measured using procedures substantially similar to those described in the Kamata et al. article Characterization of ZnSSe on GaAs by Etching and X-ray Diffraction, Journal of Crystal Growth, Vol 142, pp. 31–36 (1994). Each sample was lightly etched in a solution of Br:Methanol, and the surface observed with a dark field optical microscope. The stacking faults were clearly visible as elongated topographic features. The following are the growth details and measured stacking fault densities (/cm$^2$) for these samples.

| Sample # | Substrate Temp. for Nucleation (°C.) | RHEED Pattern Prior to ZnSe Nucleation | Substrate Temp. As Valve Closed (°C.) | Zn Treatment | Stacking Fault Density (/cm$^2$) |
|---|---|---|---|---|---|
| 1 | 315 | (1 × 4) | 540 | yes | 1 × 10$^4$ |
| 2 | 315 | (1 × 4) | 550 | yes | <1 × 10$^4$ |
| 3 | 315 | (1 × 4) | 560 | yes | <1 × 10$^3$ |
| 4 | 315 | (1 × 4) | 570 | yes | <1 × 10$^3$ |
| 5 | 315 | (1 × 4) | 580 | yes | <1 × 10$^3$ |
| 6 | 315 | (1 × 4) | 590 | yes | 8 × 10$^3$ |
| 7 | 330 | (2 × 4) | 570 | yes | 6 × 10$^6$ |
| 8 | 315 | (2 × 4) | 570 | no | 4 × 10$^5$ |

The first six samples show that there is a range of substrate temperatures at which the As should be valved off to produce an As-stabilized (2×4) surface which has a minimum of excess As, while not causing the surface to become too As deficient. Excess As is believed to be a source of stacking faults, while a surface that is too As deficient will be rough, and thus form stacking faults as well. The seventh and eighth samples show the necessity of Zn treatment: the substrate temperature of sample 7 is too high to allow the Zn to stick, while sample 8 simply has not had a Zn exposure prior to growth (other than the first segment of MEE, which is not a sufficiently long Zn exposure to saturate the GaAs surface). In both cases the (2×4) RHEED pattern is an indicator of insufficient Zn treatment.

As evidenced by these samples, the method described above enables interfaces with stacking fault densities of less than 1×10$^4$ cm$^2$ to be reproducibly fabricated, and densities below 1×10$^3$ cm$^2$ have been demonstrated. Use of the valved group V and group VI sources in a single chamber, and Zn treatment through operation of the sources to expose the GaAs buffer layer to a Zn flux prior to growth of the ZnSe buffer layer, apparently minimizes cross-contamination of the heterovalent interface and thereby reduces the presence of heterogeneities. The use of the valved group V source also enables the preparation of an As-stabilized (2×4) surface (prior to Zn treatment) which has a minimum of excess As at low wafer temperatures. The use of relatively high growth temperatures and MEE nucleation apparently increases adatom mobility on the growth surface to allow each monolayer to incorporate with sufficient microstructural integrity. However, the sample data described above indicates that the wafer temperature should be below the transition from (2×4) to (1×4) to produce relatively low defect interfaces.

Following the fabrication of interface 10 on substrate 12, the wafer is moved through pipeline 56 and into chamber 54 by the manipulator. The fabrication of laser diode 8 can then be completed in any conventional or otherwise known manner. In one embodiment, growth chamber 54 and the associated sources are set up in a conventional manner. The lower $Mg_xZn_{1-x}S_ySe_{1-y}$:Cl cladding layer 24 is an alloy grown with the Mg cell 100, ZnS cell 94, Se cell 98 and Cl cell 104. Typical values for x and y are 0.1 and 0.15, respectively, which nominally lattice-matches the cladding layer 24 to the GaAs substrate 12 while providing a 2.85 eV band-gap. The temperatures of cells 94, 98, 100 and 104 are set to generate fluxes that provide a growth rate of about 1.0 μm/hr, and a doping concentration ($N_d-N_a$) of about $1\times10^{18}$ cm$^{-3}$. Cladding layer 24 is grown to a thickness of about 1.0 μm with the wafer at a temperature of about 315° C. in this embodiment.

Although not shown in FIG. 1, buffer layers of approximately ten monolayers of ZnSe:Cl are grown by MEE in chamber 54 on the upper surfaces of both the ZnSe buffer layer 16 and cladding layer 24 to help smooth the surfaces prior to the growth of the subsequent layers (i.e., cladding layer 24 and light-guiding layer 20, respectively). The sequence and timing by which Zn cell 92, Se cell 98 and Cl 104 are operated to grow these buffer layers is similar to that of buffer layer 16 described above. The growth conditions (e.g., source fluxes and wafer temperature) are selected to deposit about one monolayer of ZnSe for every two cycles of MEE.

After the growth of cladding layer 24 and before the growth of light-guiding layer 20, the wafer is rotated so the cladding layer faces away from the cells 92, 94, 96, 98, 100, 102, 104 and 106 so there is no direct flux path between the cells and the cladding layer. Contamination from shutter outgassing is thereby reduced, while allowing the shutters to be momentarily opened for flux measurement without depositing material on the surface of cladding layer 24. The temperature of the ZnS source 94 is decreased for the growth of the $ZnS_ySe_{1-y}$ light-guiding layer 20, and the flux of this source is set to yield y≈0.065 to approximately lattice-match the light-guiding layer to GaAs substrate 12. The temperature of the Cl source 104 is also reduced to produce a net donor doping concentration $N_d-N_a\approx2\times10^{17}$ cm$^{-3}$.

Growth of the ZnSSe light-guiding layer 20 starts immediately following the MEE growth of the buffer layer. The growth rate of the light-guiding layer 20 is about 0.75 μm/hr. The light-guiding layer 20 is grown to a thickness of about 0.15 μm. Typically, a lower portion of light-guiding layer 20 adjacent to cladding layer 24 is doped n-type with Cl, while an upper doping set-back portion is undoped.

Without interrupting the operating conditions of the cells 94 and 98, and with the shutter on cell 104 closed, the $Cd_xZn_{1-x}S_ySe_{1-y}$ quantum well layer 18 is grown on the light-guiding layer 20 by opening the shutter on the Cd cell 96. Quantum well layer 18 is therefore undoped, and grown to a thickness of approximately 5 nm with a composition estimated to be x≈0.25 and y≈0.15.

By closing the shutter on Cd cell 96 following the completion of the quantum well layer 18, the growth of light-guiding layer 22 commences without interruption. A lower doping set-back portion of light-guiding layer 20 adjacent to quantum well layer 18 is undoped, while the remaining upper portion is doped p-type with N. Growth of the light-guiding layer 22 can but need not be stopped between the lower and upper portions to start the generation of N plasma. Plasma generation begins by opening the $N_2$ leak valve 110 to allow N to flow into chamber 54. When the N pressure in chamber 54 reaches about $1-5\times10^{-6}$ Torr, power to plasma source 106 is turned on. Growth of light-guiding layer 22 then continues, typically to a thickness of about 0.15 μm.

Following the completion of light-guiding layer 22, the shutters of cells 94, 98 and 106 are closed. The wafer is then rotated to a position at which the upper surface of the light-guiding layer 22 faces away from the cells 100, 92, 94, 98 and plasma source 106. Temperature of the ZnS cell 94 is then increased to its original value of about 820° C. After the temperature of cell 94 has stabilized, the wafer is rotated back and growth of the $Mg_xZn_{1-x}S_ySe_{1-y}$:N cladding layer 26 is initiated. The cladding layer 26 is grown to a thickness of about 1.0 μm over a period of about one hour, and doped to a net acceptor concentration $N_a-N_d\approx2\times10^{17}$ cm$^{-3}$. Although not shown in FIG. 1, a thin ZnSe:N buffer layer is grown on the upper surface of cladding layer 26 for about five minutes at a growth rate of about 0.5–0.7 μm/hr.

Following the completion of cladding layer 26 and the ZnSe:N buffer layer on the cladding layer, the wafer is again rotated, with the ZnSe:N buffer layer facing away from cells 92, 98 and 102 and plasma source 106. The temperature of the wafer is then ramped down to about 250° C. for the growth of graded p-type ZnSeTe ohmic contact layer 28, and the wafer is rotated back. The power of plasma source 106 is also lowered to dope the growing contact layer 28 to a net acceptor concentration $N_a-N_d\approx1\times10^{18}$ cm$^{-3}$ at this lower wafer temperature.

The first layer (not separately shown) of contact layer 28 is a layer of ZnSe:N. A short-period superlattice of alternating layers of ZnSe:N and ZnTe:N (not separately shown) is grown on the first layer using cell 102 for the Te. The thickness of the ZnTe layers is increased while the thickness of the ZnSe:N layers is decreased with increasing distance of the superlattice from the cladding layer 26 to grade the composition of the contact layer. A final layer of ZnTe:N is grown on the top of the superlattice at a rate of 0.5–0.7 μm/hr for about five minutes. All the individual layers of contact layer 28 are grown without interruption. Graded ohmic contacts such as 28 and associated methods of fabrication are generally known and disclosed, for example, in the Y. Fan et al. articles Ohmic Contact to p-Zn(S,Se) Using Pseudograded Zn(Te,Se) Structure, J. Vac. Sci. Technol. B, Vol. 11, No. 4 (July 1993), and Graded Band Gap Ohmic Contact to p-ZnSe, Appl. Phys. Lett., Vol. 61, No. 26 (December 1992).

Following the completion of contact layer 28, the wafer is cooled and removed from MBE chamber 54. Laser diode 10 is then completed in a conventional manner such as that shown in the Cheng et al. U.S. Pat. No. 5,319,219 by applying Pd electrode 30, insulating layer 32, Ti layer 34, Au layer 36 and contact 38 to the wafer.

In one embodiment, contact 38 is formed by etching the lower surface of GaAs substrate 12 for a short period of time (e.g., 2 minutes) to remove several micrometers of the substrate. Conventional GaAs etchants (e.g., 5 $H_2O$–1 $H_2O_2$–1 $NH_4OH$) can be used for this purpose. Five nanometers of Pd, 25 nanometers of Ge and 200 nanometers of Au are sequentially evaporated on the etched surface of substrate 12. The wafer including the Pd, Ge and Au layers are then annealed in nitrogen or forming gas for about 2 minutes at 180° C. In other embodiments, the substrate surface is lapped to a thickness of approximately 150 μm and polished smooth before it is etched.

Figure 3:
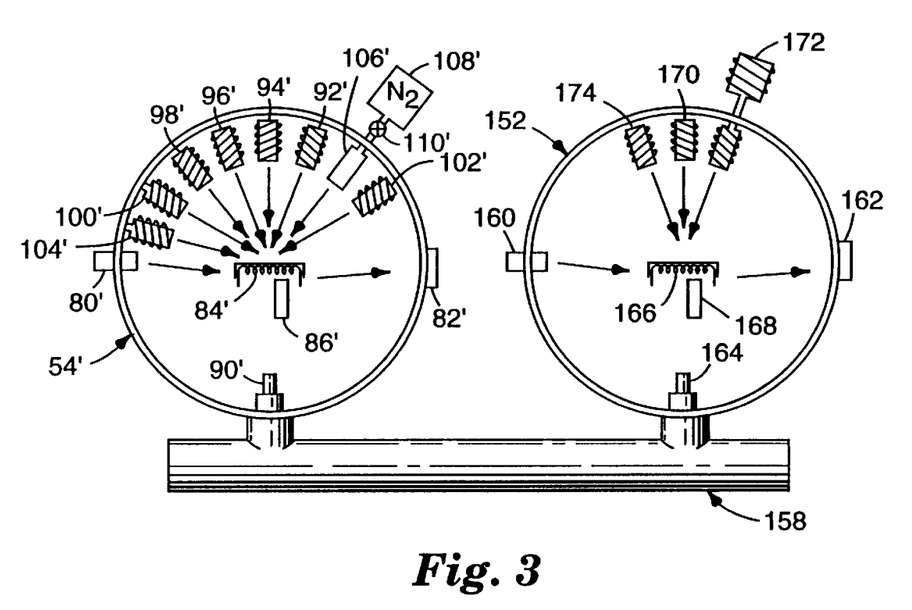
FIG. 3 is a schematic illustration of a molecular beam epitaxy system used in accordance with a second embodiment of the present invention to fabricate the III-V/II-VI interface and laser diode shown in FIG. 1.

FIG. 3 is an illustration of a molecular beam epitaxy (MBE) system 150 used in accordance with a second embodiment of the present invention to fabricate laser diode 8. As shown, MBE system 150 includes a first growth chamber 152 and a second growth chamber 54' interconnected by an ultra-high vacuum transfer pipeline 158. Chamber 152 includes a high energy electron gun 160 and phosphor screen 162 to monitor the structural characteristics of semiconductor layers using reflection high energy electron diffraction (RHEED). Chamber 152 also includes flux monitor 164, substrate heater 166 and thermocouple 168. GaAs buffer layer 14 is grown on substrate 12 in first growth chamber 152. Sources mounted to chamber 152 include a shuttered Ga effusion cell 170, a valved As cracker cell 172 and Si effusion cell 174 (as a source of n-type dopants). Growth chamber 54 ' can be identical to chamber 54 described above with reference to MBE system 50, and features of chamber 54' which are similar to those of chamber 54 are shown with identical but primed (e.g., "x'") reference numerals. As shown, chamber 54' includes high energy electron gun 80', phosphor screen 82', substrate heater 84', thermocouple 86', and flux monitor 90'. ZnSe buffer layer 16 and device layers 24, 20, 18, 22, 26 and 28 are grown in chamber 54'. Sources mounted to chamber 54' include Zn effusion cell 92', ZnS effusion cell 94' (as a source of S), Cd effusion cell 96', Se effusion cell 98' (which has an orifice which is less than about 5 mm in diameter, and preferably about 2 mm), Mg effusion cell 100' and Te effusion cell 102'. Cl effusion cell 104' (which uses $ZnCl_2$ source material) is provided as a source of n-type dopant. The p-type dopant is provided by N free radical (plasma) source 106'. Free radical source 106' is connected to a source 108' of ultra-pure $N_2$ through leak valve 110'.

GaAs buffer layer 14 is grown on substrate 12 in chamber 152. To this end, a substrate 12, which is mounted to a sample block and pre-outgassed at a temperature of about 300° C., is positioned in chamber 152 by the manipulator. Substrate 12 is deoxidized in preparation for the growth of GaAs buffer layer 14. This procedure is performed by opening the valve on cell 172 to provide an As flux in chamber 152, while heating the substrate 12 to its oxide desorption or deoxidation temperature (about 600° C.). The RHEED pattern on the surface of the substrate 12 is monitored during this heating operation for indications of deoxidation, and the (deoxidation) temperature at which deoxidation is clearly observed is noted or recorded. When deoxidation is observed, the temperature of the substrate 12 is further increased to a temperature about 40°–50° C. higher than the deoxidation temperature for a period (about 5 minutes) to remove any residual oxides. Substrate 12 is then allowed to cool and stabilize (typically 5 minutes or less) to a III-V semiconductor growth temperature about equal to the deoxidation temperature (i.e., about 600° C.).

Following the substrate outgassing and deoxidation procedure, the growth of GaAs buffer layer 14 is initiated by opening the shutter on Ga cell 170. The RHEED pattern is monitored during the growth of the GaAs buffer layer 14, and the As flux is set to a level slightly above that required to maintain an As-stabilized (2×4) reconstruction during the growth. The temperature of the As cracker cell is maintained at about 775° C. The shutter on Si cell 174 is also opened to dope the growing GaAs buffer layer 14 n-type with Si in a conventional manner. In one embodiment, layer 14 is doped to a net donor concentration of about $1-5\times10^{18}$ $cm^{-3}$. At these operating characteristics the growth rate of GaAs buffer layer 14 has been observed to be about 1 $\mu$m/hour.

Growth of GaAs buffer layer 14 is stopped by closing (shuttering off) Ga and Si effusion cells 170 and 174, respectively. The wafer is then allowed to cool to a temperature suitable for transfer through the pipeline. In one embodiment of the fabrication process, the wafer is cooled to a temperature of about 300° C. over a time period of about 20 minutes. This cooling is done initially under an As flux. When the buffer reaches a temperature which is about 20°–30° C. below the GaAs growth temperature, the valve on As cell 172 is closed. Quickly thereafter, the RHEED pattern changes from As-stabilized (2×4) to Ga-stabilized (3×1). Upon further cooling, the RHEED pattern slowly transforms back to an As-stabilized (2×4) reconstruction (at a temperature of about 400°–450° C.). After the valve on As cell 172 has been closed, the cracker zone of the As cell is cooled to 500° C.

In another embodiment (not shown), a shuttered As cracker effusion cell is used in place of the valved As cracker cell 172. In this embodiment, the As cell is shuttered off when the wafer has cooled to a temperature of about 300° C. after growth of the GaAs buffer layer 14. The RHEED pattern ultimately changes from (2×4) to c(4×4) which is indicative of excess As on the GaAs surface. Although this is not currently believed to be the best method for preparation of buffer layer 14, it is still possible to achieve relatively low stacking fault densities by using the transfer and ZnSe growth initiation techniques described below.

Following the growth of GaAs buffer layer 14, the wafer is transferred from chamber 152 to chamber 54' through pipeline 158. The wafer transfer is performed quickly to minimize contamination by particles in pipeline 158, and is initiated at a temperature of about 300° C. Initiation of the transfer at this elevated temperature helps to minimize condensation of contaminants onto the surface of buffer layer 14 during transfer. Holding the wafer at this temperature prior to transfer also prevents any residual As within chamber 152 from sticking to the surface of buffer layer 14. This transfer process therefore helps to reduce stacking faults at the interface between buffer layers 14 and 16.

After the wafer is transferred to chamber 54', its temperature is quickly increased. In one embodiment, where the starting GaAs surface is c(4×4), the temperature is increased until the RHEED pattern changes to a (2×1) or (2×4) which is indicative of the removal of excess As. This RHEED pattern change is typically observed at a substrate temperature of about 450° C., with the temperature being elevated to this level in approximately 10 minutes. The use of a Se effusion cell 98' having a plug with a central orifice of about 1 mm provides better shuttering of the Se flux than effusion cells with wider orifices or no orifice plugs. During the period of time that the temperature is being raised the wafer is also positioned within chamber 54' in such a manner that there are no direct paths between any of the sources and the surface of GaAs buffer layer 14. The wafer is rotated to orient the surface of buffer layer 14 toward the sources when the RHEED pattern is to be monitored to observe pattern changes. The operation of growth chamber 54' in this manner reduces likely sources of stacking faults at the interface between buffer layers 14 and 16.

The transition temperature at which the c(4×4) RHEED pattern changes is noted. The substrate is then heated to a temperature of about 20° C. above the transition temperature for about one or two minutes to ensure total transition. The wafer is then allowed to cool to the ZnSe growth temperature of about 280° C.–320° C. The shutter on Zn effusion cell 92' is opened to expose the wafer to a Zn flux when the temperature drops below about 400° C.

In another embodiment, where the starting GaAs surface is (2×4), the temperature of the wafer is increased to the ZnSe growth temperature (about 280° C.–320° C.) over a Period of about 10 minutes. While the temperature is increasing the wafer is oriented within chamber 54' in such a manner that there are no direct paths between any of the sources in the chamber and the surface of the GaAs buffer layer 14. When the temperature of the wafer has stabilized, the wafer is rotated to orient the surface of buffer layer 14 toward the sources in preparation for growth. The shutter on Zn effusion cell 92' is then opened to expose the wafer to a Zn flux.

In yet another embodiment, the shutter on Zn effusion cell 92' is opened when the wafer temperature reaches a nominal value of about 430° C.–470° C., and while the surface of buffer layer 14 is rotated away from the sources. With no direct paths between the sources and the surface of GaAs buffer layer 14, the possibility of contamination is further reduced. The wafer is then rotated toward the surface and the RHEED pattern observed as the temperature is adjusted to the ZnSe growth temperature.

Growth of the ZnSe buffer layer 16 is initiated when the wafer temperature has stabilized at the desired ZnSe growth temperature. ZnSe buffer layer 16 is then grown using the alternating beam epitaxy techniques (e.g., ALE or MEE) described above with reference to MBE system 50. Sample wafers including GaAs/ZnSe interfaces grown in MBE system 150 in the manner described above on GaAs substrates have exhibited stacking fault densities at or near $1 \times 10^4/cm^2$. Following the growth of ZnSe buffer layer 16, chamber 54' can be operated in a manner identical to chamber 54 of MBE system 50 described above to grow device layers 24, 20, 18, 22, 26 and 28. Prior to the growth of cladding layer 24, a layer of ZnSe (not shown) can be grown on buffer layer 16 using the MEE growth techniques described immediately above. In one embodiment, ten or more cycles of MEE are used to grow a layer of ZnSe on buffer layer 16 prior to the growth of subsequent layers of laser diode 8. When the growth of contact layer 28 is complete, the wafer can be cooled and removed from MBE chamber 54' and completed in a conventional manner such as that shown in the Cheng et al. U.S. Pat. No. 5,319,219 by applying electrode 30, insulating layer 32, Ti layer 34, Au layer 36 and contact 38 to the wafer.

Although the present invention has been described with reference to preferred embodiments, those skilled in the art will recognize that changes can be made in form and detail without departing from the spirit and scope of the invention. In particular, although described with reference to a ZnSe interface on a GaAs substrate, the invention can be used to grow layers of ZnSSe, CdZnSSe, MgZnSSe and other II-VI semiconductor compounds on GaP and other III-V semiconductor substrates.

What is claimed is:

1. A method for fabricating a III-V/II-VI semiconductor interface, including:
   providing a molecular beam epitaxy (MBE) system including at least the following sources:
   a group III element source;
   a group II element source;
   a group V element source; and
   a valved group VI element source;
   providing a semiconductor substrate having a III-V semiconductor surface on which the interface is to be fabricated, and positioning the substrate within the MBE system;
   heating the semiconductor substrate to a temperature suitable for III-V semiconductor growth and growing a crystalline III-V semiconductor buffer layer on the III-V semiconductor surface of the substrate while the valve on the group VI source is closed;
   adjusting the temperature of the semiconductor substrate to a temperature suitable for II-VI semiconductor growth after growing the III-V buffer layer, and growing a crystalline II-VI semiconductor buffer layer on the III-V buffer layer by alternating beam epitaxy, including operating the group II and group VI sources to expose the III-V buffer layer to a group II element flux and growing a layer of the group II element before exposing the III-V buffer layer to a group VI element flux and growing a layer of the group VI element.

2. The method of claim 1 wherein the step of adjusting the temperature of the semiconductor substrate and growing the II-VI buffer layer includes:
   lowering the temperature of the semiconductor substrate to a II-VI semiconductor growth temperature which is less than the III-V semiconductor growth temperature;
   operating the group II source to expose the III-V buffer layer to the group II element flux when the temperature of the semiconductor substrate has decreased to a group II flux exposure temperature which is less than the III-V semiconductor growth temperature; and
   operating the group II and group VI sources to grow the II-VI buffer layer when the temperature of the semiconductor substrate has decreased to the II-VI semiconductor growth temperature.

3. The method of claim 1 wherein the substrate is a GaAs substrate, and the II-VI buffer layer is a layer including Zn and Se.

4. The method of claim 3 wherein:
   the step of growing the III-V semiconductor buffer layer includes growing a GaAs buffer layer on the GaAs substrate; and
   operating the group II and group VI sources to grow the II-VI buffer layer includes growing the buffer layer including Zn and Se on the GaAs buffer layer after the GaAs buffer layer exhibits (2×4) reconstruction.

5. The method of claim 1 wherein the III-V buffer layer is a GaAs buffer layer and the II-VI buffer layer is a buffer layer including Zn and Se.

6. The method of claim 1 and further including the step of growing, over the III-V/II-VI interface layers of II-VI semiconductor which function as a laser diode.

7. The method of claim 1 wherein:
   the step of providing an MBE system includes providing a first MBE chamber including at least the following sources:
   the group III element source;
   the group II element source:
   the group V element source; and
   the valved group VI element source;
   the group V element source includes a valve;
   the step of heating the substrate and growing the III-V buffer layer includes growing the crystalline III-V semiconductor buffer layer on the III-V semiconductor surface of the substrate while the valve on the group VI source is closed; and
   the step of adjusting the substrate temperature and growing the II-VI buffer layer includes growing the crystalline II-VI semiconductor buffer layer on the III-V buffer layer while the valve on the group V source is closed.

8. The method of claim 7 wherein:
   the III-V buffer layer is a GaAs buffer layer;
   the II-VI buffer layer is a buffer layer including Zn and Se;
   the method further includes providing an electron diffraction system to monitor structural characteristics of the semiconductor layers grown in the chamber; and
   the step of growing the II-VI semiconductor buffer layer includes:
   stopping injection of the group III element;
   lowering the temperature of the semiconductor substrate while injecting the group V element;
   closing the valve on the group V source when the temperature of the semiconductor substrate has decreased to a first temperature less than the III-V semiconductor growth temperature;

injecting the group II element when the temperature of the semiconductor substrate has decreased to a second temperature less than the III-V semiconductor growth temperature, the second temperature being a temperature lower than the first temperature;

monitoring the structural characteristics of the III-V buffer layer for reconstruction transitions from group V stabilized (2×4) reconstruction to (1×4) reconstruction; and adjusting the temperature of the substrate to the II-VI semiconductor growth temperature.

9. The method of claim 8 wherein the III-V buffer layer is a GaAs buffer layer, the II-VI buffer layer is a buffer layer including Zn and Se, and wherein the step of injecting the group II element includes injecting the group II element when the temperature of the semiconductor substrate has decreased to a second temperature which is less than about 400° C.

10. The method of claim 1, wherein the step of growing the II-VI semiconductor buffer layer further includes growing the II-VI semiconductor buffer layer by alternating beam epitaxy after the III-V buffer layer exhibits (2×4) reconstruction.

11. The method of claim 10 wherein the III-V substrate is a GaAs substrate, the III-V buffer layer is a GaAs buffer layer, and the II-VI buffer layer is a buffer layer including Zn and Se.

12. A method for fabricating a II-VI semiconductor laser diode on a III-V semiconductor substrate, including:

providing a first molecular beam epitaxy (MBE) chamber including at least the following sources:
a group III element source;
a group II element source;
a valved group V element source; and
a valved group VI element source;

providing a III-V semiconductor substrate, and positioning the substrate within the MBE chamber;

growing a crystalline III-V semiconductor buffer layer on the III-V substrate while the valve on the group VI source is closed; and growing a crystalline II-VI semiconductor buffer layer on the III-V buffer layer by alternating beam epitaxy while the valve on the group V source is closed.

13. The method of claim 12 wherein:
the method further includes:
providing an electron diffraction system to monitor structural characteristics of the semiconductor layers grown in the chamber; and
providing a temperature monitor for monitoring the temperature of the semiconductor substrate within the chamber;

the step of growing the III-V buffer layer includes heating the semiconductor substrate to a temperature suitable for III-V semiconductor growth; and the step of growing the II-VI semiconductor buffer layer includes:
stopping injection of the group III element;
lowering the temperature of the semiconductor substrate while injecting the group V element;
closing the valve on the group V source when the temperature of the semiconductor substrate has decreased to a first temperature less than the III-V semiconductor growth temperature;
injecting the group II element when the temperature of the semiconductor substrate has decreased to a second temperature less than the III-V semiconductor growth temperature, the second temperature being a temperature lower than the first temperature;
monitoring the structural characteristics of the III-V buffer layer for reconstruction transitions from group V stabilized (2×4) reconstruction to group V stabilized (1×4) reconstruction; and
adjusting the temperature of the substrate to a II-VI semiconductor growth temperature.

14. The method of claim 12 wherein:
the step of providing the substrate includes providing a GaAs substrate;
the step of growing the III-V buffer layer includes growing a GaAs buffer layer; and
the step of growing the II-VI buffer layer includes growing a buffer layer including Zn and Se.

15. The method of claim 12 wherein the step of growing the II-VI buffer layer includes growing a layer of the group II element before growing a layer of the group VI element.

16. A method for fabricating a II-VI semiconductor laser diode on a III-V semiconductor substrate, including:

providing a first MBE chamber including at least a group III element source and a group V element source;

providing a second MBE chamber including at least a group II element source and a group VI element source;

providing an ultra-high vacuum transfer pipeline between the first and second MBE chambers;

providing a III-V semiconductor substrate, and positioning the substrate within the first MBE chamber;

heating the semiconductor substrate and growing a III-V buffer layer on the substrate in the first MBE chamber;

transferring the semiconductor substrate with the III-V buffer layer from the first MBE chamber to the second MBE chamber through the pipeline;

adjusting the temperature of the substrate to the II-VI growth temperature in the second MBE chamber; and growing a II-VI buffer layer on the III-V buffer layer in the second MBE chamber by alternating beam epitaxy after the III-V buffer layer exhibits (2×4) reconstruction, including operating the group II element source to expose the III-V buffer layer with (2×4) reconstruction to a group II element flux and growing a layer of the group II element before exposing the III-V buffer layer to a group VI element flux and growing a layer of the group VI element.

17. The method of claim 16 wherein the step of adjusting the temperature of the semiconductor substrate and growing the II-VI buffer layer includes:

adjusting the temperature of the semiconductor substrate to a group II flux exposure temperature which is less than the III-V semiconductor growth temperature;

operating the group II source to expose the semiconductor substrate to a group II element flux; and operating the group II and group VI sources to grow the II-VI buffer layer when the temperature of the semiconductor substrate is at the II-VI semiconductor growth temperature.

18. The method of claim 16 wherein the III-V substrate is a GaAs substrate, the III-V buffer layer is a GaAs buffer layer and the II-VI buffer layer is a buffer layer including Zn and Se.

19. The method of claim 16 wherein:
the step of adjusting the temperature of the semiconductor substrate includes lowering the temperature of the semiconductor substrate to a substrate transfer temperature which is less than the III-V growth temperature in the first MBE chamber after growing the III-V buffer layer and before transferring the substrate to the second MBE chamber;

the step of growing the II-VI buffer layer includes increasing the temperature of the semiconductor substrate in the second MBE chamber to a temperature which is greater than the II-VI growth temperature and at which the surface reconstruction changes from c(4×4) to (2×4); and the method further includes adjusting the temperature of the substrate to the II-VI growth temperature after the substrate temperature has been increased to the reconstruction transition temperature.

20. The method of claim 16 and further including:

orienting the semiconductor substrate with the III-V buffer layer away from the group II and group VI sources while adjusting the temperature of the substrate to the II-VI growth temperature;

operating the group II source to produce a group II element flux before the step of orienting the substrate with the III-V buffer layer toward the group II and group VI sources; and orienting the semiconductor substrate with the III-V buffer layer toward the group II and group VI sources, and growing the II-VI buffer layer.

21. The method of claim 16 wherein the group VI element source includes an orifice having a diameter less than about 5 mm.

22. A method for fabricating a III-V/II-VI semiconductor interface, including:

providing a molecular beam epitaxy (MBE) system including at least the following sources:
  a group III element source;
  a group II element source;
  a group V element source; and
  a group VI element source;

providing a semiconductor substrate having a III-VI semiconductor surface on which the interface is to be fabricated, and positioning the substrate within the MBE system;

growing a crystalline III-V semiconductor buffer layer on the III-V semiconductor surface of the substrate; and growing a crystalline II-VI semiconductor buffer layer on the III-V buffer layer by alternating beam epitaxy after the III-V buffer layer exhibits (2×4) reconstruction, including operating the group II and group VI sources to expose the III-V buffer layer with (2×4) reconstruction to a group II element flux and growing a layer of the group II element before exposing the III-V buffer layer to a group VI element flux and growing a layer of the group VI element.

23. A method for fabricating a II-VI semiconductor laser diode on a III-V semiconductor substrate, including:

providing a first molecular beam epitaxy (MBE) chamber including at least the following sources:
  a group III source;
  a group II source;
  a group V source; and
  a valved group VI source;

providing a III-V semiconductor substrate, and positioning the substrate within the MBE chamber;

growing a crystalline III-V semiconductor buffer layer on the III-V substrate while the valve on the group VI source is closed; and growing a crystalline II-VI semiconductor buffer layer on the III-V buffer layer by alternating beam epitaxy.

24. The method of claim 23 wherein the step of growing the II-VI buffer layer includes growing a crystalline II-VI semiconductor buffer layer on the III-V buffer layer by alternating beam epitaxy after the III-V buffer layer exhibits (2×4) reconstruction, including operating the group II and group VI sources to expose the III-V buffer layer with (2×4) reconstruction to a group II element flux and growing a layer of the group II element before exposing the III-V buffer layer to a group VI element flux and growing a layer of the group VI element.

25. The method of claim 24 wherein the III-V substrate is a GaAs substrate, the III-V buffer layer is a GaAs buffer layer, and the II-VI buffer layer is a buffer layer including Zn and Se.

26. The method of claim 23 wherein the III-V substrate is a GaAs substrate, the III-V buffer layer is a GaAs buffer layer, and the II-VI buffer layer is a buffer layer including Zn and Se.

27. A method for fabricating a II-VI semiconductor laser diode on a III-V semiconductor substrate, including:

providing a first molecular beam epitaxy (MBE) chamber including at least the following sources:
  a group III source;
  a group II source;
  a group V source; and
  a group VI source;

providing a III-V semiconductor substrate, and positioning the substrate within the MBE chamber;

growing a crystalline III-V semiconductor buffer layer on the III-V substrate; and growing a crystalline II-VI semiconductor buffer layer on the III-V buffer layer by alternating beam epitaxy after the III-V buffer layer exhibits (2×4) reconstruction, including operating the group II and group VI sources to expose the III-V buffer layer with (2×4) reconstruction to a group II element flux and growing a layer of the group II element before exposing the III-V buffer layer to a group VI element flux and growing a layer of the group VI element.

28. The method of claim 27 wherein the III-V substrate is a GaAs substrate, the III-V buffer layer is a GaAs buffer layer, and the II-VI buffer layer is a buffer layer including Zn and Se.

* * * * *